United States Patent [19]

Shimbo

[11] 4,352,238
[45] Oct. 5, 1982

[54] PROCESS FOR FABRICATING A VERTICAL STATIC INDUCTION DEVICE

[75] Inventor: Masafumi Shimbo, Tokyo, Japan

[73] Assignee: Kabushiki Kaisha Daini Seikosha, Tokyo, Japan

[21] Appl. No.: 139,754

[22] Filed: Apr. 14, 1980

[30] Foreign Application Priority Data

Apr. 17, 1979 [JP] Japan .................................. 54/46898

[51] Int. Cl.³ .................... H01L 21/225; H01L 29/72
[52] U.S. Cl. ........................................ 29/579; 29/571;
29/580; 148/174; 148/187; 148/188; 156/628;
156/657; 156/662; 357/22; 357/54; 357/56;
357/59
[58] Field of Search ...................... 29/571, 579, 580;
148/174, 187, 188; 156/628, 657, 662; 357/59,
22, 54, 56

[56] References Cited

U.S. PATENT DOCUMENTS

| | | | |
|---|---|---|---|
| 3,372,067 | 3/1968 | Schafer | 148/187 |
| 3,676,230 | 7/1972 | Rice | 148/188 |
| 3,740,835 | 6/1973 | Duncan | 29/578 |
| 3,753,807 | 8/1973 | Hoare et al. | 148/188 X |
| 3,940,288 | 2/1976 | Takagi et al. | 148/187 X |
| 4,063,967 | 12/1977 | Graul et al. | 29/578 X |
| 4,127,931 | 12/1978 | Shiba | 29/578 X |
| 4,182,023 | 1/1980 | Cohen et al. | 29/579 X |
| 4,200,878 | 4/1980 | Ipri | 29/571 X |

Primary Examiner—L. Dewayne Rutledge
Assistant Examiner—W. G. Saba
Attorney, Agent, or Firm—Robert E. Burns; Emmanuel J. Lobato; Bruce L. Adams

[57] ABSTRACT

A method of fabricating a vertical static induction semiconductor device comprising depositing a polycrystalline silicon film on a single crystal silicon layer, and forming an insulating film comprised of silicon nitride on the polycrystalline film. The insulating film is selectively etched to form islands of the insulating film overlying areas where a gate region and a main electrode region of the semiconductor device are to be formed. An oxide film is formed on the surface regions exposed by etching, and the oxide film is used as a mask for controlling introduction of impurity atoms to form the gate region and the main electrode region.

2 Claims, 18 Drawing Figures

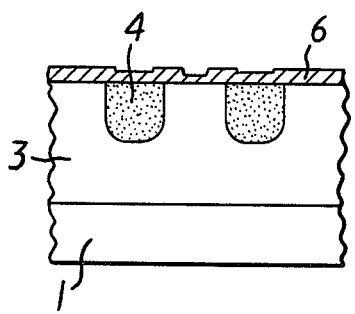
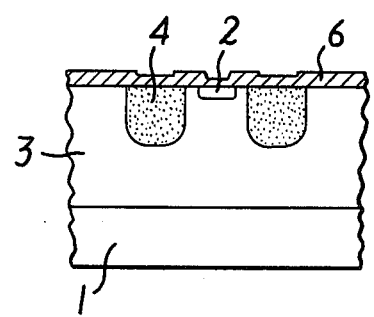
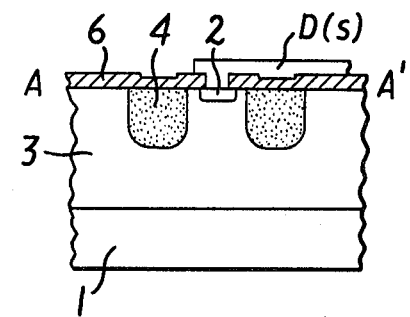
FIG. 1(a) PRIOR ART    FIG. 1(b) PRIOR ART    FIG. 1(c) PRIOR ART
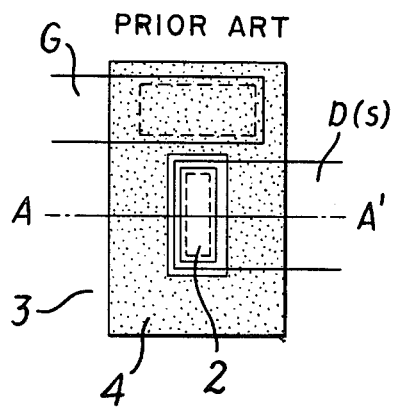
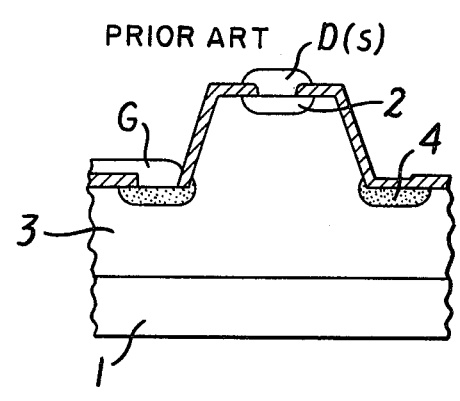
FIG. 1(d) PRIOR ART    FIG. 2 PRIOR ART
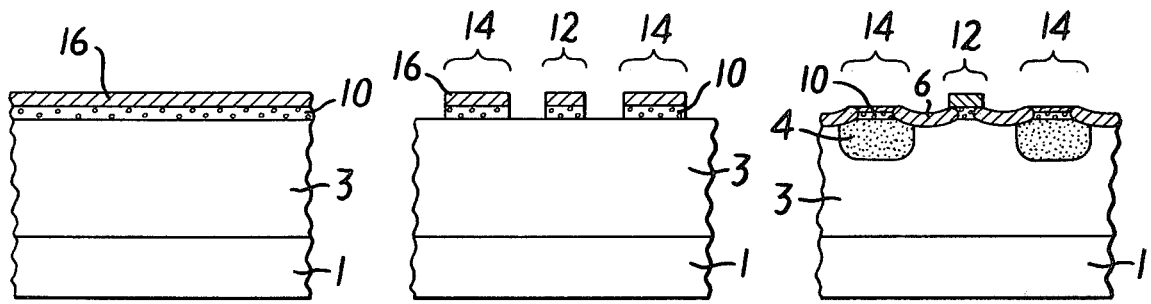
FIG. 3(a)    FIG. 3(b)    FIG. 3(c)
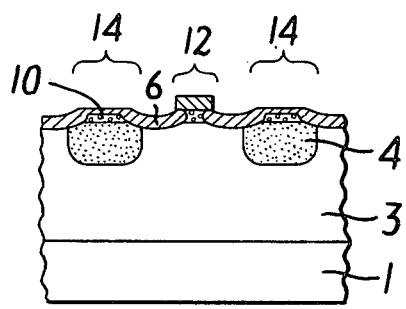
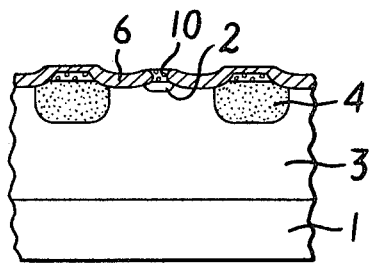
FIG. 3(d)    FIG. 3(e)

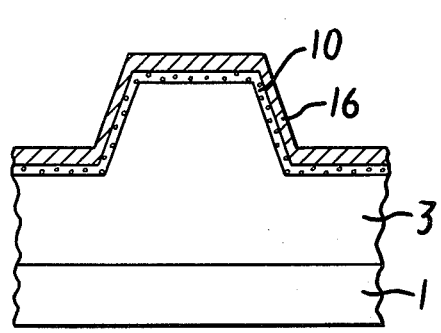
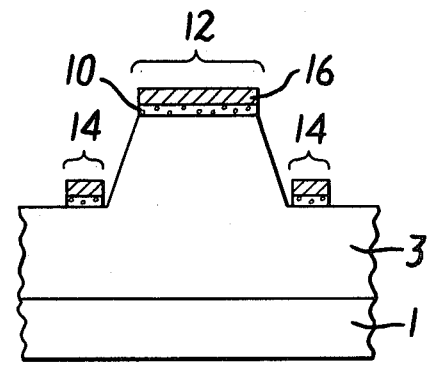
FIG. 4(a)  FIG. 4(b)
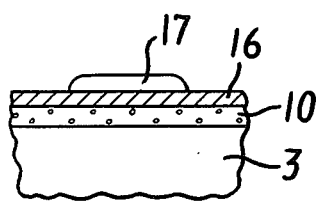
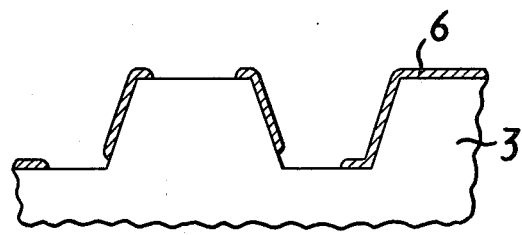
FIG. 5(a)  FIG. 6(a)
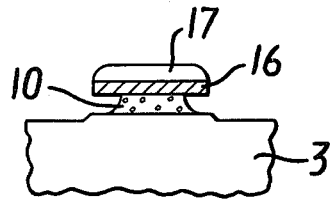
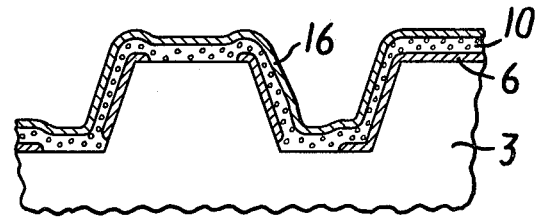
FIG. 5(b)  FIG. 6(b)
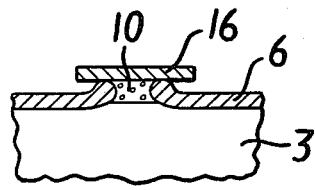
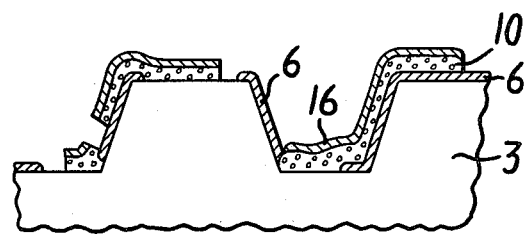
FIG. 5(c)  FIG. 6(c)

PROCESS FOR FABRICATING A VERTICAL STATIC INDUCTION DEVICE

BACKGROUND OF THE INVENTION

The present invention relates to a manufacturing process of a semiconductor device, and more particularly to a process of manufacturing a static induction type semiconductor device, such as a static induction transistor (SIT) and an integrated circuit involving the SIT.

Interest in a SIT or a SIT integrated circuit focuses on high frequency or high speed operation with a lower power consumption, and moreover its simple fabrication. On the other hand, to obtain better performance of the SIT devices, a microprocessing technique is also required. The problems to be solved in the manufacturing process for the conventional planar type SIT shown in FIG. 1 are mentioned below. FIG. 1 illustrates a unit of N channel SIT, and the following description is made for one unit which is used as a SIT in the almost SIT integrated circuits. FIG. 1(a) shows a sectional view, wherein a N epitaxial growth layer 3 and an oxide film on a N+ Si substrate (a source or a drain) 1, and a P+ gate region 4 is selectively diffused. The gate spacing 4 i.e. the inner spacing between the P+ gate region 4 depends on an impurity concentration of the growth layer 3, the design whether the SIT is normally off or on, etc. In a logic circuit, the normally off type device is usually used where the gate spacing is chosen to be less than two times of a width of the depletion layer induced by a diffusion potential of a P+N junction. In FIG. 1(b), a drain N+ region (or source region) 2 is formed by the selective diffusion of N-type impurity. Since it is preferable that the N− region lies between the N+ region 2 and the P+ region 4 to reduce the capacitance and to increase the break-down voltage, the small dimension of the window opened for the N+ selective diffusion is required with the higher positional accuracy. In FIG. 1(c), a metal evaporation is carried out after opening SiO2 windows of contacts, and the metal wiring is finished. The microprocessing technique is also required to open the contact window of the drain (or source) N+ region 2. In FIG. 1(d), the plane view of an accomplished SIT of one unit is illustrated, and the space between the metals such as the drain (or source) D(s) and the gate G will be narrower depending on the scale-reduction of the element. When the SIT fabricated simply as described above composes an injection type logic with a lateral PNP bipolar transistor (BJT), the logic operates with extremely low energy, i.e. about 2fJ/gate of the power-delay time product (P·t product). As obviously seen from FIG. 1(d), one way for improving the above described performance is to reduce the whole area or the undesired portion of the gate P+ region 4 and to furthermore minimize the N+ region 2.

FIG. 2 shows one example of the conventional construction for improving the above described drawbacks, and its construction is known as a step cut type SIT. In this case, the gate P+ region 4 is formed in the bottom of a stepped portion where a source series resistance is small in an inverted type SIT (in which the top of the stepped portion is used for the drain) as well as the capacitance because of a lengthened interval between the P+ region 4 and the N+ region 2. However the existance of the grooves prevents the N+ region 2 on the top of the stepped portion, the P+ region 4 in the bottom portion and the metal wiring from being sufficiently formed owing to the thickness distribution of the resist film or the gap between the mask and the exposed area.

BRIEF DESCRIPTION OF THE DRAWINGS

FIG. 1(a) to FIG. 1(d) are drawings for explaining the fabrication process of the conventional SIT, FIG. 1(d) is a plan view and FIGS. 1(a) to 1(c) are sectional views along line A—A'.

FIG. 2 is a sectional view of the conventional step cut type SIT,

FIG. 3(a) to FIG. 3(e) and FIGS. 4(a) and 4(b) are sectional views of a unit of SIT, which are used for explaining the process of the present invention, FIGS. 5(a) to 5(c) are sectional views for the explanation of the application process of the present invention, and FIGS. 6(a) to 6(c) are sectional views for the explanation of another example of the application process of the present invention.

DETAILED DESCRIPTION OF THE INVENTION

The present invention is invented in view of the drawbacks or the problem to be solved in the conventional process, and it is an object of the present invention to provide a minimized SIT which is easily fabricated by using a polycrystal thin film of low impurity concentration or non-doped in order to obtain the higher performance of the SIT. The present invention will be hereinafter described in conjunction with the attached drawings. FIG. 3 show steps of the fabrication process according to the present invention in correspondence to the process for the planar N channel SIT with a vertical structure as shown in FIG. 1.

The following description is made for the inverted (upward) type SIT in which a drain is formed on the surface, and the description is also applicable to the vertical (downward or substrate-drain) type SIT. In FIG. 3(a), after the N− growth layer 3 is formed on the N+ silicon substrate (or buried layer) 1, a silicon polycrystal 10 with lower impurity concentration is directly deposited on the surface of the N− growth layer 3, and furthermore, the polycrystal 10 is coated by a Si3N4 film. The impurity concentration in the polycrystal layer 10 is preferably lower than that of the N− growth layer 3, and the non-doped one is also desired. The deposition of the polycrystal film 10 on the single crystal N− growth layer 3 can be carried out by the CVD of the SiH4 pyrolysis under low temperature, e.g. less than 800° C. The CVD of the polycrystalline film is also performed at low temperatures using a chloride or halide of silicon such as SiCl4, SiHCl3, or an organic compound of silicon, as well as a plasma deposition. The thickness of the polycrystal layer 10 can be decided at a predetermined thickness depending on the purpose, and is usually choosen between 0.2 to 2 [μm]. The deposition of the Si3N4 film can be also carried out by the CVD method, for example, under the condition of the existance of NH3. It is useful to form a SiO2 film of the thickness of approximately 500 to 2000 A as a buffer film between the polycrystal silicon film 10 and the Si3N4 film, and the Si3N4 film may be a film containing the oxygen. One example of the thickness of the Si3N4 film 16 is the value of 1000 to 2000 A.

In FIG. 3(b), islands 14 and 12 consisting of the polycrystal Si film 10 and the Si3N4 film 16, respectively, are photolithographically formed at the positions where a gate region and a drain region should be formed in the latter process. The $Si_3N_4$ film 16 can be selectively removed by using a dry etching technique such as a plasma-etching or a sputtering-etching, or a wet etching technique using a phosphoric acid. The Si polycrystal film can be also selectively removed by the dry etching technique or the wet etching technique using a HF mixture. The etching rate of the polycrystal material is larger than that of the single crystal material so that it is easy to control so as to finish the etching near the surface of the single crystal. Also, even if the polycrystal Si film can not be perfectly removed, there is no trouble in the following steps.

Next, as shown in FIG. 3(c), the selective oxidation using the $Si_3N_4$ film 16 as the mask is carried out to form the $SiO_2$ film 6, whose thickness is approximately within the range of 0.3 to 2[μ]. The part of the polycrystal film 10 that remains due to imperfect etching in the step of (b) can be easily converted into the oxide film. If the buffer $SiO_2$ film is formed under the $Si_3N_4$ film 16, the thickness of selectively formed oxide is preferably more than that of the buffer film. In the step shown in FIG. 3(c), since the oxidation rate of the polycrystal is higher than that of the single crystal, the polycrystalline film 10 under the $Si_3N_4$ film 16 converts effectively into the oxide 6, which makes the windows for gate and drain-diffusion to be narrow, as mentioned below.

In FIG. 3(d), the $Si_3N_4$ film of the island 14 for the gate region is removed using rough photolithography, and the P type impurity is doped into the $N^-$ growth layer 3 through the polycrystal film 10 by using a conventional diffusion technique or an ion implantation technique to form the $P^+$ gate region 4. Since the impurity diffusion in the polycrystal is fast, the time requiring for the diffusion is roughly equal to that of the diffusion in the conventional process shown in FIG. 1. During or after this diffusion, the oxide is formed on the diffusion window so as to be thick enough to act as the mask for the $N^+$ diffusion that follows and also to preserve unoxidized Si polycrystalline film 10.

As shown in FIG. 3(e), a window is formed by the removal of $Si_3N_4$ film on the island 12 in a similar way to FIG. 3(d), and the $N^+$ diffusion operation is carried out to form the drain region 2. Hereafter, the contact windows are opened, followed by the metal wiring. Since the Si polycrystal film 10 lies on each diffusion region, there is the advantage that the spike phenomenon of the metal can be eliminated even into shallow diffused regions.

The above mentioned process has advantages in that the positions and sizes of the gate region and the drain region are determined by only one process of photolithography in FIG. 3(b), and that the very narrow windows for diffusions can be obtained during the selective oxidation process. Furthermore, it will be possible to open the diffusion windows in the following process steps by using photolithography which requires no critical and accurate operations. These advantages can be obtained by the use of only one mask step compared with the conventional process.

FIG. 4 shows an example of the fabrication processes of a step cut type SIT according to the present invention. Grooves are formed on the surface by plasma etching or wet etching after the $N^-$ growth layer 3 is formed on the $N^+$ substrate 1 as shown in FIG. 4(a), followed by the depositions of the polycrystal film 10 and the $Si_3N_4$ film 16 similarly to the way shown in FIG. 3. After this, a process similar to that of planar SIT fabrication as shown in FIG. 3 can be applied. In the case of a step cut type SIT, it is more effective for the deposition of the $Si_3N_4$ film to use the directional evaporation or sputtering technique. That is, since the $Si_3N_4$ film is scarcely deposited on the side walls of the grooves, the $Si_3N_4$ film on the top and bottom surfaces of the grooves can be easily isolated by slight etching so that the fine mask is not required. Next, as shown in FIG. 4(b) the polycrystal 10 and the $Si_3N_4$ film 16 other than all of the projected portion and a part of the bottom portion is removed to obtain the $Si_3N_4$-poly Si islands 12 and 14 for drain and gate regions without the high accuracy of photomasking.

Furthermore, the present invention is most preferable in the case of the following example. As shown in FIG. 5(a), the polycrystal layer 10 and the $Si_3N_4$ film 16 is deposited on the $N^-$ growth layer 3 and a resist 17 is left at a predetermined portion. As shown in FIG. 5(b), after the $Si_3N_4$ film is selectively removed, the polycrystal film 10 is selectively etched by using the mask of the $Si_3N_4$ film 16 or the resist 17. As mentioned above, since the etching rate of the polycrystal is fast, it is possible to consciously carry out the side etching of the polycrystal film 10 in the lateral direction to such an extent that the lateral etching is more than the film thickness to make a narrow poly-Si island almost without etching of the growth layer 3. Hereafter, as shown in FIG. 5(c), if the selective oxidation is carried out, the polycrystal film 10 is effectively made slender so as to obtain the fine diffusion window.

This method according to the invention is most effective to form a narrow gate region as well as narrow drain region without fine patterning technology such as electron beam lithography, etc. When this method is applied to bipolar devices or MOS devices, high base resistance and low $h_{fe}$ are obtained in the bipolar or the channel is too shortened in the MOS, because of a too narrow base, emitter (collector) or channel. On the other hand, since SIT operates under the gate voltage control and a concentration effect of drain current occurs in the intrinsic gate, as described in ISSCC Technical Digest p. 222 (February 1977), a narrow gate region and a narrow drain region cause no degradation of electrical characteristics, rather they contribute to decrease of capacitance.

In FIG. 6, another embodiment of the present invention is illustrated. This is the embodiment in which the polycrystal is used as a part of the wiring or as an exposed material under the contact windows. For example the area of inactive gate region can be reduced when the contact portion occupying the most part of the inactive gate $P^+$ region is made of the polycrystal layer. For another example, a part of the wiring between the bottom face and the top face can be reliably made of the polycrystal film in the case of a stepped (or grooved) structure. In FIG. 6, an embodiment having a stepped structure is illustrated. Referring to FIG. 6(a), after the surface is covered with the insulating film (such as a $SiO_2$ film or a $Si_3N_4$ film) 6, windows are opened at and near the gate portion and the drain portion, in which process there are no severe limitations for line width and the location of the windows. As in the foregoing embodiments, as shown in FIG. 6(b), the polycrystal film 10 and $Si_3N_4$ film 16 is deposited. In FIG. 6(c), the $Si_3N_4$-poly Si islands are formed on the drain and the gate region and a part of these islands is extended on the insulating film 6. Next, followed by a process similar to that of the above-mentioned embodiment, the impurity is doped to the polycrystal film which becomes low in resistance. Thus, it is possible to wire between formed regions in the growth layer 3 partially by using the polycrystal film 10 on the insulation film 6, and also possible to form the contact portion for metal wiring without a large capacitance.

As described above, according to the present invention, it is advantageous that the P or N region can be easily and finely formed by the impurity doping through the windows of selectively oxidized film, making use of the polycrystal film with a low impurity concentration. Moreover, the areas of the contact portion which are not necessary as the gate regions for the transistor operation and the other undesirable portions can be easily reduced through the fabrication process according to the invention. Although the example for Si polycrystal has been described, an amorphous silicon thin film and a porous silicon film can be also used for the same purpose to attain the same effects.

Although a N channel SIT is described as the concrete embodiment, it is clear that the device with opposite conductivity type can be realized according to the present invention, and that the present invention is applicable to the lateral type device, vertical (or downward) type device and inverted (or upward) type device. The present invention is applicable not only to the SIT device, but also to the FET having the same construction as that of the SIT. As mentioned above, the present invention is applicable to a lower power consumption IC, a high frequency or a high speed logic IC which is fabricated by using the fine-pattern technique. Thus, the industrial value of the present invention is remarkable.

What is claimed is:

1. A method of fabricating a vertical static induction-type semiconductor device having main electrode regions, a channel region and a gate region, wherein one of the main electrode regions and the gate region are formed on a surface of the channel region, said method comprising the steps of:
   (a) providing a semiconductor substrate having a first conductivity type and a low resistivity, said semiconductor substrate defining a first main electrode region of the vertical static induction-type semiconductor device;
   (b) forming a single crystal silicon layer of the first conductivity type and having a high resistivity on a surface of the semiconductor substrate, said single crystal silicon layer defining the channel region of the vertical static induction-type semiconductor device;
   (c) depositing a polycrystalline silicon film having a lower impurity concentration than that of the channel region on a major surface of said single crystal silicon layer;
   (d) forming an insulating film comprised of silicon nitride on said polycrystalline film;
   (e) selectively etching said insulating film for forming islands of the insulating film overlying the portions of the channel region surface at which the gate region and one of the main electrode regions are to be formed;
   (f) side-etching said polycrystalline film using the island of said insulating film as a mask to narrow the portions of said polycrystalline film overlying the gate region;
   (g) selectively oxidizing the side-etched polycrystalline film and exposed regions of the channel region surface using the insulating film as a mask;
   (h) selectively removing portions of the insulating film to form a window through the selectively oxidized oxide on the polycrystalline film overlying the gate region;
   (i) introducing impurity atoms having a conductivity type opposite that of the channel region through the window in the oxide on the polycrystalline film and into the gate region, the impurity atoms being effective to impart to the gate region a conductivity type opposite that of the channel region, the impurity atoms penetrating the polycrystalline film as they are introduced into the gate region, and the penetration of the polycrystalline film being carried out under conditions effective to oxidize the polycrystalline film; and
   (j) forming one of the main electrode regions at the surface of the channel region by removing a portion of the insulating film and introducing impurity atoms of the first conductivity type through the polycrystalline film into the surface region of the channel region where the main electrode region is to be formed.

2. A method of fabricating a vertical static induction-type semiconductor device according to claim 1, wherein the channel region has a depressed surface portion at least on opposite sides of the portion of the channel region surface where the main electrode region is to be formed, and said insulating film is formed thinner on the side surfaces of the depressed surface portion than on other surfaces.

* * * * *